United States Patent [19]
Suzuki et al.

[11] 3,778,887
[45] Dec. 18, 1973

[54] ELECTRONIC DEVICES AND METHOD FOR MANUFACTURING THE SAME

[75] Inventors: Jinichiro Suzuki; Kenzi Takezawa; Takanori Takeda, all of Tokyo, Japan

[73] Assignee: Hitachi, Ltd., Tokyo, Japan

[22] Filed: Dec. 15, 1971

[21] Appl. No.: 208,092

[30] Foreign Application Priority Data

Dec. 23, 1970 Japan ............................ 45/115658
Jan. 22, 1971 Japan ............................ 46/1580

[52] U.S. Cl. ........................ 29/588, 29/627, 29/193
[51] Int. Cl. ............................................ B01j 17/00
[58] Field of Search ................. 29/576 S, 588, 627, 29/628, 589

[56] References Cited

UNITED STATES PATENTS

| | | | |
|---|---|---|---|
| 3,478,420 | 11/1969 | Grimes et al. | 29/627 |
| 3,482,419 | 12/1969 | Rogers et al. | 29/576 S |
| 3,484,533 | 12/1969 | Kauffman | 29/576 S |
| 3,662,089 | 5/1972 | Harding | 29/628 |

*Primary Examiner*—Charles W. Lanham
*Assistant Examiner*—W. Tupman
*Attorney*—Craig et al.

[57] ABSTRACT

Manufacturing of power semiconductor devices utilizing a metal strip and a lead frame. The metal strip has a plurality of portions on which semiconductor chips are mounted, and fastening means constituted by indents at the longer sides of the strip and metal pieces protruding along the indents. The lead frame has a plurality of lead units and tab portions corresponding to the indents. The lead frame is locked over the metal strip by inserting the tab portions into the corresponding indents and bending the metal pieces toward the tab portions. After encapsulating the combinations of the lead units and the portions having the chips thereon with plastic material, respectively, the metal strip and the lead frame are cut along the portions of the tab-metal piece combinations, thereby to obtain a plurality of individual power semiconductor devices.

7 Claims, 19 Drawing Figures

INVENTORS

JINICHIRO SUZUKI, KENZI TAKEZAWA,

TAKANORI TAKEDA

BY Craig, Antonelli & Hill
ATTORNEYS

INVENTORS

JINICHIRO SUZUKI, KENZI TAKEZAWA,

TAKANORI TAKEDA

BY Craig, Antonelli & Hill

ATTORNEYS

INVENTORS
JINICHIRO SUZUKI, KENZI TAKEZAWA,
TAKANORI TAKEDA
BY Craig, Antonelli & Hill
ATTORNEYS INVENTORS
JINICHIRO SUZUKI, KENZI TAKEZAWA,
TAKANORI TAKEDA
BY Craig, Antonelli & Hill
ATTORNEYS Fig. 12
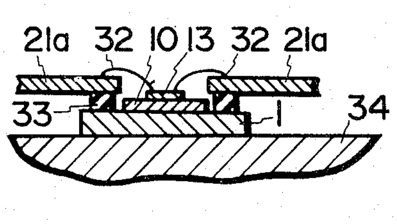
Fig. 13(A) Fig. 13(B)
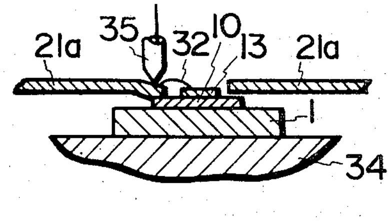
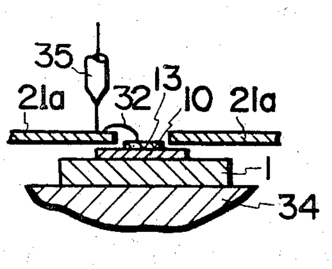
Fig. 14(A)
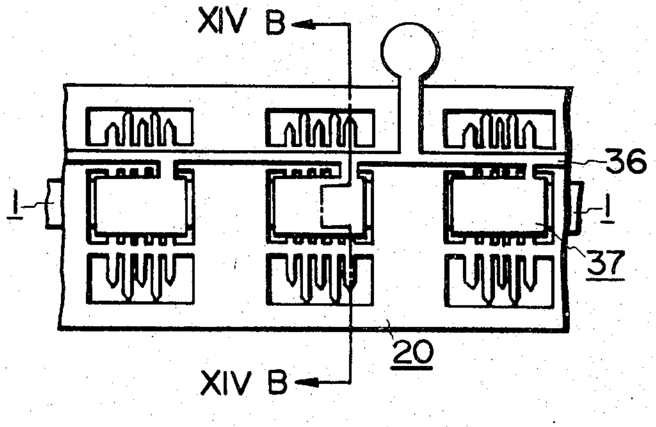
INVENTORS
JINICHIRO SUZUKI, KENZI TAKEZAWA,
BY TAKANORI TAKEDA
Craig, Antonelli & Hill
ATTORNEYS

PATENTED DEC 18 1973

3,778,887

SHEET 6 OF 7

INVENTORS

JINICHIRO SUZUKI, KENZI TAKEZAWA,

TAKANORI TAKEDA

BY Craig, Antonelli & Hill

ATTORNEYS

INVENTOR
JINICHIRO SUZUKI, KENZI TAKEZAWA, TAKANORI TAKEDA
BY
Craig, Antonelli & Hill
ATTORNEYS

ELECTRONIC DEVICES AND METHOD FOR MANUFACTURING THE SAME

This invention relates to electronic devices such as power transistors and power integrated circuits and to methods for assembling such semiconductor devices.

In plastic molded power electronic devices, large metallic substrates are generally used for heat dissipation on which semiconductor chips are mounted. In assembling the devices metal lead frames are engaged with the metallic substrates and the chips. However there is room for improvements with respect to various operations in assembling processes, for example, positioning of the substrates, chips and lead frames or a mold for plastic encapsulation of the devices.

The invention will be explained by way of examples with references to the accompanying drawings in which.

Figure 11A:
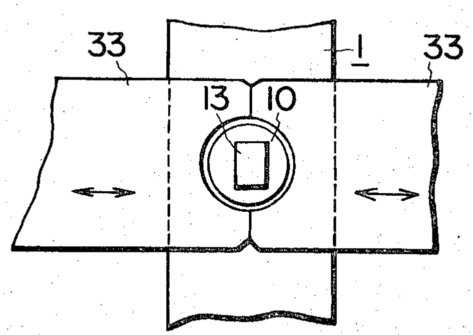
FIG. 11(A) is a plan view showing the relative position of a metal substrate, a semiconductor chip and a metal supporter or spacer in bonding connector wires.
Figure 14B:
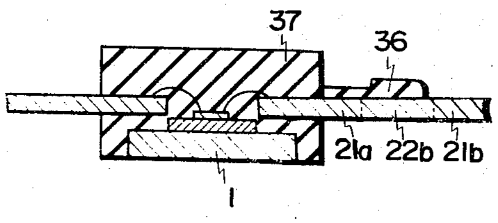
Figure 15:
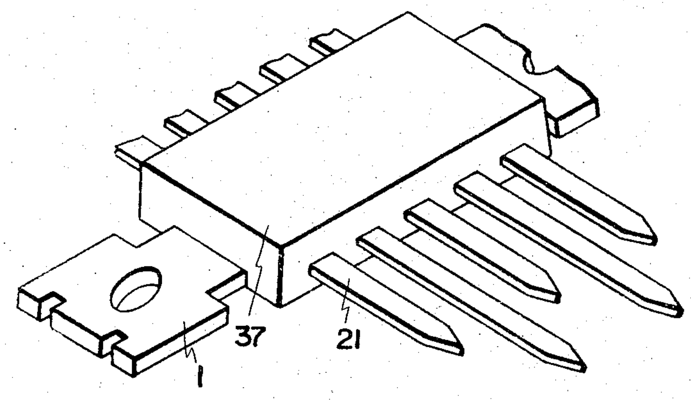

FIGS. 11(B), 12, 13(A) and 13(B) are sectional views each showing a method for providing electrical connections between a semiconductor chip and leads;

FIG. 14(A) is a plan view showing a plastic molded combination of the lead frame and the metal strip;

FIG. 14(B) is a sectional view of a plastic molded semiconductor device taken along the line XIV — XIV of FIG. 11(A);

FIG. 15 is a perspective view of a completed electronic device; and

Figure 16:
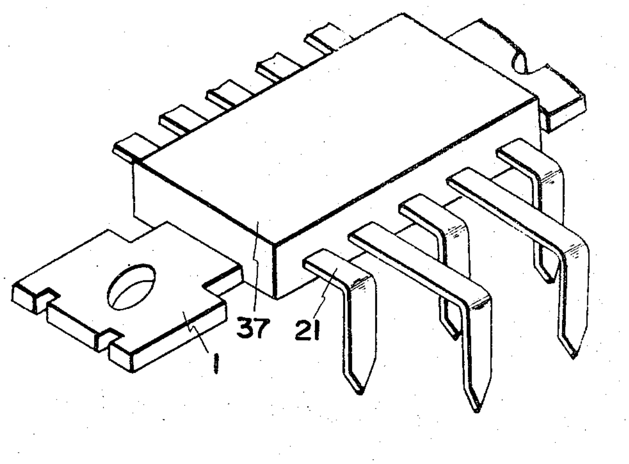

FIG. 16 is a perspective view showing another shape of leads in a completed electronic device.

It is an object of the present invention to provide a new and an improved assembling structure of a power electronic device.

It is another object of the present invention to provide a new and improved sturcture of a metallic substrate on which a semiconductor chip is mounted.

It is further object of the present invention to provide a new and improved structure of a lead frame to be engaged with the metallic substrate.

It is still further object of the present invention to provide a new and improved method of assembling an electronic device using combination of a metallic substrate and a lead frame.

It is still further object of the present invention to provide a new and improved method of encapsulating electronic devices with plastic material.

Referring now to the drawings like reference numerals are used throughout the various views to designates like parts.

Figure 1:
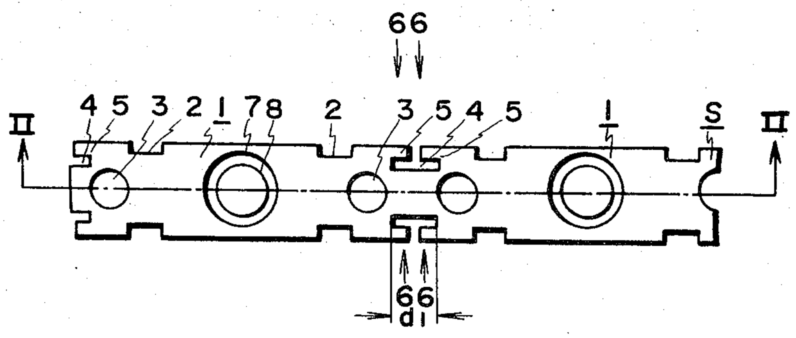
FIG. 1 is a plan view of a series of metal substrates for heat dissipation.
Figure 2:
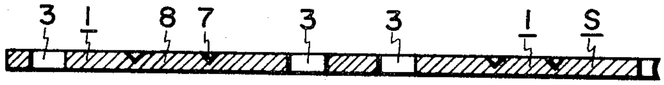
FIG. 2 is a sectional view of the metal substrates taken along line II — II of FIG. 1.

In FIG. 1, a metal strip S comprising a series of portions each to be a metal substrate 1 for heat dissipation is shown. A section of the metal strip S taken along II — II line in FIG. 1 is shown in FIG. 2. Although in the drawings only two substrates 1 are shown for convenience, in the actual production a plurality of these substrates 1, for example, ten pieces of like substrates 1 are simultaneously punched out of a metal plate. As material for the metal strip S is used high thermal conductivity material, such as, copper, aluminum, an alloy thereof or a laminated plate of these materials. The size of each substrate 1 is, for example, 1.26 mm in thickness, 8 mm in width and 30 mm in lenght.

As shown in FIG. 1, the metal strip S has indented portions 2 for stopping the leakage of molten plastic material in a molding step, holes 3 for fastening the substrate 1 with an external heat sink using bolts in each completed electronic device, slits 4 for inserting tabs of a lead frame therethrough, protrusions or fastening pieces 5 for locking the tabs, and grooves 7 each for defining a place 8 on which a semiconductor chip is to be placed.

As can be seen from FIG. 1, along each slit 4 a pair of the protrusions 5 are disposed so as to face to each other. The tabs of the lead frame can be fastened to the strip S by slightly bending the protrusions 5 into the slits 4 by a relatively small force from the directions shown by arrows 6. As the fastening pieces 5 bridged shapes, which close the slits 4, may be used instead of the protrusions. The protrusions 5 may be formed in hook shapes so that the tips of the protrusions 5 extend into the slits 4 in parallel to the vertical direction of the metal strip S. In order to position the lead frame on the right place of the substrates 1 and to effectively utilize the flexibility of the lead frame for fastening it on the substrate 1, it is desirous that each substrate 1 has two pairs of the protrusions 5 on opposite sides of the metal strip S as shown in FIG. 1, although the protrusions 5 are not always needed in pairs.

Also, the slits 4 may be formed so as to extend perpendicularly to the lengthwise direction of the metal strip S.

The whole parts of the metal strip S may be punched out of a metal plate by only one pressing step. It is desirable that the grooves 7 and slits 4 are simultaneously formed in order to provide an accurate positioning of the lead frame against each mounted semiconductor chip.

Figure 3:
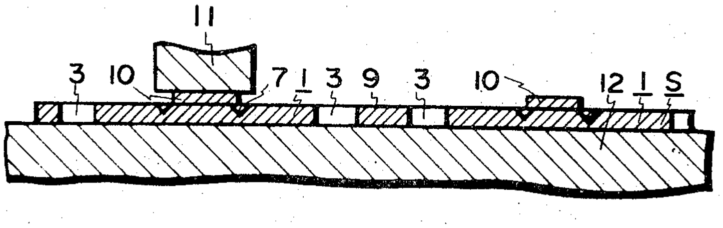
FIG. 3 is a sectional view showing a step of welding a silver foil on each nickel plated substrate.

Referring to FIG. 3, the surface 9 of the metal strip S is plated with a metal film of nickel about 5 $\mu$ thick. The nickel film acts as an anti-corrosive film and also as an electric resistance in the following electric welding step of a silver foil. The thickness of the metal film may be in a range of 1 $\mu$ to 10 $\mu$, and as a material thereof Cr, Mo, W, an alloy of these metals or an alloy of these metals and other proper metals may be used. Silver foils 10, on which semiconductor chips are to be mounted, are welded by electric welding locally on the nickel plated surface of the metal strip S. The thickness of the silver foils 10 may be in a range of 200 $\mu$ to 1200 $\mu$, for example, of 500 $\mu$. By the provision of the silver foils 10 as a cushion, bad influences or damages due to thermally caused distortion, which would be caused to the semiconductor chips if such chips be directly mounted on the metal substrates 1 of copper or aluminum, can be prevented and also the heat dissipation of each completed device is improved. Since silver is relatively soft a large semiconductor chip, for example, of 4.5 mm by 4.5 mm in dimensions can be mounted on the silver foil 10 without causing such detrimental thermal distortions. Reference numerals 11 and 12 partially designate electrodes for the electric welding.

Since in the electric welding of the silver foils 10 only the interfaces of the silver foils 10 and the nickel film are melted, the welded silver foils 10 keep their upper surfaces flat for semiconductor chips to be soldered uniformly. Also, the deterioration of the metal substrates 1 due to heat is avoided since only the surfaces of the metal substrates 1 are locally heated.

As another method for bonding the silver foils 10 the well-known cold-welding method can be applied. By this method since both the silver foils 10 and the nickel film are not needed to be fused there is no fear of the deterioration of the metal substrates 1. Also the flatness of the silver foils 10 are kept during the cold-welding. In this case, the silver foils 10 are welded directly to the metal strip S, and then the nickel film is plated on the remaining surface of the strip S with covering the silver foils 10 with corrosion resistance material such as resin.

The silver foils 10 may also be bonded on the copper substrates 1 by forming a silver-copper eutectic alloy therebetween at relatively low temperature.

Alternatively, the silver foils 10 may be connected by soldering or by enitrely melting the silver foils 10 where the surface of the metal strip S is covered with material, such as Mo or W, which has a substantially high melting point than silver has. In these methods care must be taken for preventing the deterioration of the metal substrates 1 since the metal substrates 1 are heated to a higher temperature than in the step of mounting semiconductor chips.

Figure 4:
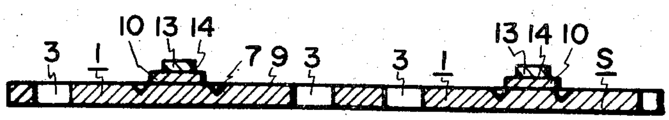
FIG. 4 is a sectional view of the metal substrates shown in FIG. 3 each having an electronic device thereon.

Referring to FIG. 4, a semiconductor chip 13 of a power amplifier integrated circuit of 2.5 mm by 2.0 mm in dimensions is mounted on each silver foil 10 by forming a gold-silicon eutectic alloy at a temperature of about 440°C. The semiconductor chips 13 may be connected to the foils 10 through conductive bonding agent containing powdered gold or silver. Such method is easy to practise because a heating step is not involved. The latter method, however, is inferior to the soldering using a gold-silicon eutectic alloy in respect to the heat resistance and the mechanical strength. On the upper surface of each semiconductor chip 13 is formed an insulating film of $SiO_2$ or $Si_3N_4$ having holes therein, conductive layers interconnecting circuit components, such as transistors, diodes and resistors formed in the chip 13, and extending on the insulating film and through the holes, and electrode terminals formed along the edge of the chip 13 for connecting wires thereto.

The silver foils 10 and the chips 13 may be mounted on the metal substrates 1 after the substrates 1 are united with a lead frame.

Figure 5:
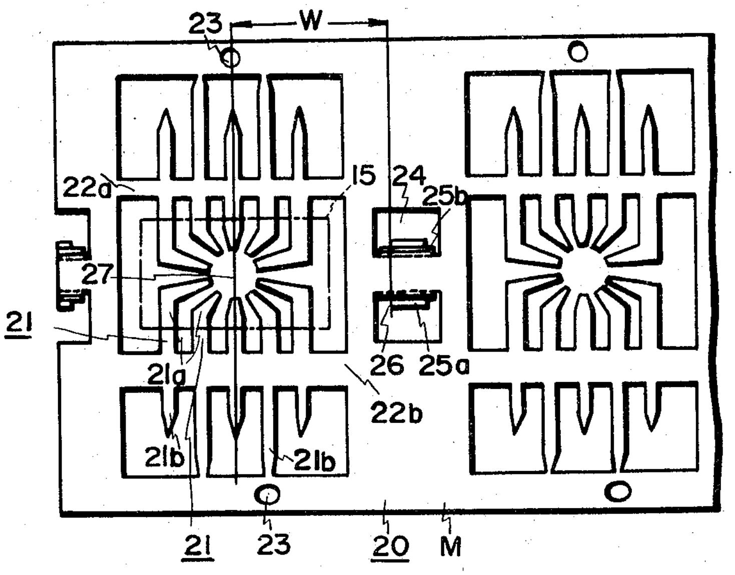
FIG. 5 is a plan view of a multiple-unit lead frame.

FIG. 5 shows a plan view of a lead frame 20 comprising multiple units of leads 21 each unit being of 0.25 mm thickness and 30 mm width. Such the multiple-unit lead frame 20 can be carved out of an elastic metal plate of, for example, phosphor bronze by the photo-engraving technique and by bending the tab portions by pressing.

The multiple-unit lead frame 20 may also be formed by first punching a metal plate and then bending the tabs 25 by pressing. The multiple units of leads 21 and tab portions 25 may be formed simultaneously, or each unit and each pair of tabs 25 may be cut and bent successively by repeating the identical operation of punching in order to simplify the structure of the punch.

In FIG. 5 internal portions 21a of the leads 21 located within the rectungle shown by a chain line 15 are to be enclosed in plastic encapsulation material. The ends of the internal portions 21*a* are arranged so as to be corresponded to the electrode terminals on the semiconductor chip 13. External portions 21*b* of the leads 21 are to be extended out of the plastic encapsulation.

Individual leads 21 are joined by tie strips 22*a* and 22*b* (collectively referred to tie strips 22). The tie strips 22 may be located on any portions of the leads 21, but preferably adjacently to the portions to be enclosed in the plastic material in order to mechanically support the internal and external portions 21*a* and 21*b*. Each tie strip 22 also acts as a barrier for preventing the flow of plastic or resinous material in the transfer molding step as explained in U.S. Pat. No. 3,423,516. The tie strips 22*a* and 22*b* are different from each other in their width. The difference in the width can be used for distinguishing the direction of the lead frame 20. The wider strip 22*b* will be used as a portion constitutes, with a mold, a passage for guiding plastic material in the transfer molding process. Each end of the external portions 21*b* is tapered for easing the installation of the completed devices on a printed circuit board. And tapered ends of some external portions 21*b* are connected to metal bands M for preventing the external portions 21*b* from being damaged or transformed during the manufacturing porcesses. Holes 23 formed in the metal bands M act as positioning guides during the successive assembling processes.

Figure 6:
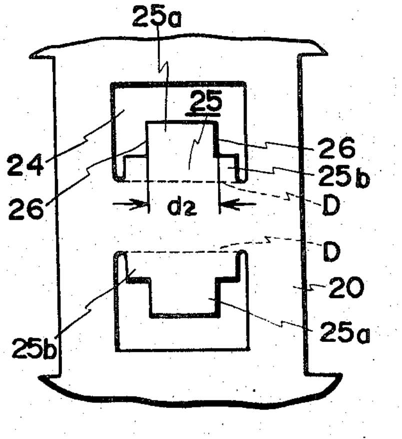
FIG. 6 is a plan view of tab portions of a lead frame at one step during the manufacture thereof.

As shown in FIG. 6, each tab 25 is provided with two portions 25*a* and 25*b*. The narrower portion 25*a* of the tab is to be inserted into the corresponding slit 4 of the metal strip S. The wider portion 25*b* of the tab acts as a spacer to maintain the lead frame 20 from the metal strip S in a predetermined distance.

The tabs 25 and the internal portions 21*a* of the leads 21 are simultaneously carved out of a metal plate by the photoengraving technique in order to position the internal portions 21*a* of the leads accurately on the semiconductor chips mounted on metal strip S. The tabs 25 are bent along th dotted lines D by pressing. Width W shown in FIG. 5 must not be changed by bending the tabs 25. Instead of the photo-engraving method, the tabs 25 and the lead units 21 may be formed by means of punch and press.

Such lead frame 20 is plated with a silver film about 1$\mu$ thick or more for improving solidability and corrosion proofness of the leads 21 and for facilitating the connection of wiring connectors to the internal portions 21*a* of the leads. The silver film is plated on the lead frame 20 after the lead frame 20 is carved out of a metal plate and the tabs 25 are bent. Or such lead frame 20 having a silver film may be cut out of a silver plated metal sheet. As the plated metal film gold may be used for silver while in consideration of the relatively high cost of gold silver is preferable.

In the preceding process since the tabs 25*a* are bent along the dotted lines D which extend in parallel with the lengthwise direction of the lead frame 20, the distance W on the major plane of the lead frame 20 between one side 26 of each tab 25*a* and the centeral point 27 to which the internal portions 21*a* of the leads 21 are concentrated is maintained to a predetermined value before and after the bending of the tabs 25, whereby the lead frame 20 is positioned on the metal strip S in an extremely accurate relationship. Theoretically, the positioning of the lead frame 20 and the metal strip S can be attained only by one tab 25 for a lead frame 20 having multiple units of leads 21.

Figure 7:
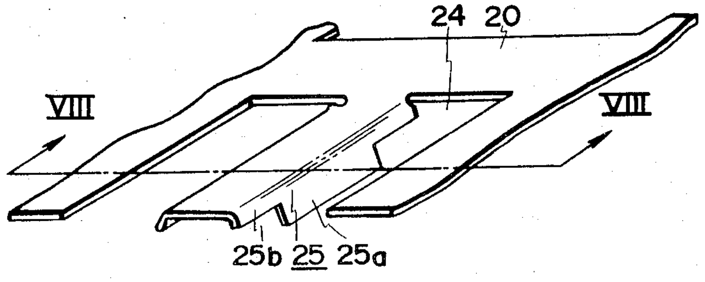
FIG. 7 is a perspective view of the tab portions of the lead frame.
Figure 8:
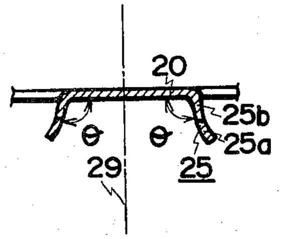
FIG. 8 is a sectional view of the tab portions taken along the line VIII — VIII of FIG. 7.

A perspective view illustrating the bent tabs 25 is shown in FIG. 7. The tabs 25 are provided in pairs. Two tabs 25 of each pair are, as shown in FIG. 8, symmetrical to each other with respect to an imagainal plane 29 perpendicular to the major plane of the lead frame 20.

Angles $\theta$ between the bent tabs 25 and the major plane of the lead frame 20 are a little greater than 90° but sufficiently less than 180°, preferably in a range of 95° to 120°. The tips of the tabs 25*a* are flexed outwardly so as to utilize the elastic forces thereof in fixing the lead frame 20 to the metal strip S. Also, in order for the tabs 25 to be easily inserted into the slits 4 of the metal strip S it is desirous to form the tips of the tabs 25*a* so as to be registered to the centers of the corresponding slits 4 of the metal strip S.

As the material for the lead frame 20 such material as Kovar, Fe-Ne alloy and nickel may be also used. The spacer tabs 25*b* may be formed in portions of the lead frame 20 spaced from the tabs 25*a*. It is preferable, however, to form the spacer tabs 25*b* unitarily with the tabs 25*a* for simplifying the pattern of punches and for preventing stresses caused during locking the lead frame 20 to the metal strip S from reaching the internal leads 21*a*.

Without the spacer tabs 25*b*, a certain space between the metal strip S and the lead frame 20 may be given by stopping the tips of the tabs 25*a* inserted in the slits 4 at a plane surface of a jig on which the metal strip S is placed during the locking step.

Figure 9:
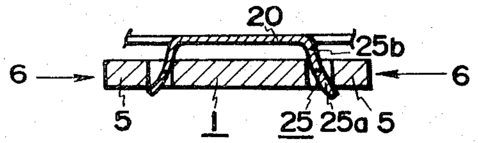
FIGS. 9 and 10 are respectively a sectional view and a plan view showing the relative position of a metal strip and a lead frame.

As shown in FIG. 9 the tabs 25*a* of the lead frame 20 are inserted in the slits 4 of the metal strip S having semiconductor chips 13 thereon. The ends of the tabs 25*b* contacts the surface of the metal strip S so as to maintain a predetermined space between the lead frame 20 and the metal strip S.

The width $d_1$ of the slits 4 shwon in FIG. 1 is nearly the same as the width $d_2$ of the tabs 25*a* shown in FIG. 6. The difference between $d_1$ and $d_2$ must be in the range of deviations allowable between the semiconductor chip 13 and the ends of the corresponding internal leads 21*a*. The tips of the tabs 25*a* are preferably tapered in order to smooth the insertion of the tabs 25*a* into the slits 4. By precisely adjasting the width $d_1$ of the slits 4 and the width $d_2$ of the tab 25*a*, each unit of the internal leads 21*a* are positioned around the corresponding semiconductor chip mounting place 8 in an accurate relationship.

As shown in FIG. 9, the tabs 25*a* inserted in the slits 4 are firmly locked by bending the protrusions 5 against the tabs 25*a* with forces shown by arrows 6, the spring actions of the flexed tabs 25*a* cooperate with the bent protrusions 5 in holding the lead frame 20 against the metal strips S.

Figure 10:
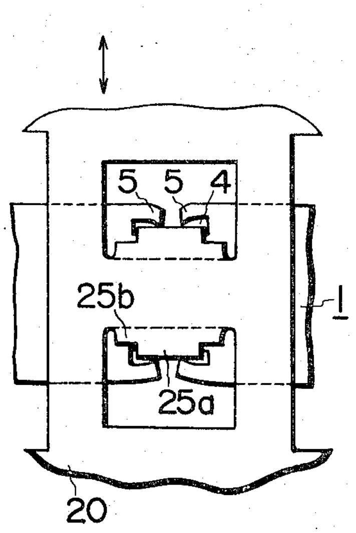

FIG. 10 shows a plan view of combination of the lead frame 20 and the metal strip S in which the end portions of the bent protrusions 5 clamp the tabs 25*a*. By this combination, the lead frame 20 is prevented from being moved against the metal strip S in the direction shown by the arrow in FIG. 10. Theoretically, only a pair of the tabs 25*b* are needed in the lead frame 20 to prevent the movement of the lead frame 20 against the metal strip S. In this embodiment, stresses caused by bending the protrusions 5 are relatively small and cutting of the combination of the lead frame 20 and the metal strip S into a plurality of combinations of the lead units and the substrates 1 are easily carried out, compared to such a case as using continuous strips instead of the protrusions 5.

Figure 11B:
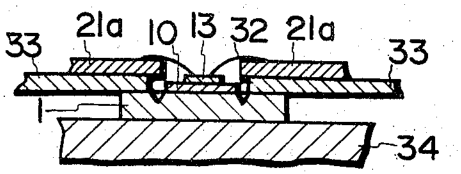

FIGS. 11(A) and 11(B) show a method of electrically connecting the individual internal leads 21a to the corresponding electrode terminals of the chip 13 by connector wires 32. The connector wires 32 are of, for example, Au or A1, and have a diameter of about 50 $\mu\phi$. The connector wires of gold may be connected to the electrode terminals of aluminum and silver plated internal leads 21*a* by the well-known thermal oppression bonding process. Aluminum wires may be also used in the case of the ultrasonic bonding.

As shown in FIGS. 11(A) and 11(B), supporters 33 of high thermal conductivity metal such as Fe or Cu are disposed under the internal lead portions 21*a* in order to prevent the internal leads 21*a* from being flexed during the bonding of connector wires 32 on the internal lead portions 21*a*. These metal supporters 33 are removed after the bonding. The metal strip S is placed on a heating means 34 for heating the bonding portions of the internal lead portions 21*a* and the electrode terminals of the chips 13. The supporters 33 interposed between the internal lead portions 21*a* and the metal strip S conduct heat to the bonding portions. Both in the thermal compression bonding and the ultrasonic bonding, the ends of the internal lead portions 21*a* and the electrode terminals of the chip 13 are needed to be heated to a temperature of about 350°C. and 100°C., respectively. As shown in FIG. 12, as the supporter or spacer 33 a ring of insulating material or ceramic, such as alumina and beryllia which is a good conductor of heat may be also used. Such ceramic ring is provided on a predetermined portion of the metal substrate 1 arround the silver foil 10 before joining the metal strip S with the lead frame 20 and is not needed to be removed after the bonding.

FIGS. 13(A) and 13(B) show another method of bonding the connector wires by using the silver foil 10 for the supporters 33. As shown in FIG. 13(A), by moving down the capillary 35 which holds the connector wires 32 bonded on the electrode terminal of the chip 13, the tip of the lead 21*a* is flexed to contact the surface of the foil 10 or the substrate 1, while the lead 21*a* is heated. The connector wire 32 is connected to the lead 21*a* while the wire 32 and the lead 21*a* are compressed between the capillary 35 and the foil 10 or the substrate 1.

As soon as the capillary 35 is taken away from the connector wire 32, the wire 32 is recovered straight by its elasticity to be spaced from the foil 10 as shown in FIG. 13(B). In this case it must be considered to have an allowance in the lenght of the connector wire 32 enough to adjust the movement of the lead 21*a* since the wire 32 is pulled upward with the lead 21*a*. Or, the wire 32 is first connected to the lead 21*a* and then connected to the corresponding electrode terminal of the chip 13 after the lead 21*a* is recovered straight. Alternatively, the end portions of the internal leads 21a may be directly bonded on the corresponding electrode terminals of the chip 13 without using connector wires.

As shown in FIGS. 14(A) and 14(B), the resulting assemblies are encapsulated in suitable encapsulating material such as plastic resin by the well-known transfer molding process. The resinous material is forced into cavity of the mold through a guide pipe to form plastic encapsulation 37 provided on the wider tie strip 22*b* in co-operation with the mold, and then is cured. After taking the resulting combination out of the mold, the plastic material 36 in the guide pipe is removed.

The tie strips 22*a*, 22*b* and the metal band M are then cut away, and the resulting combination is cut along the lines crossing the tabs 25 and the slits 4 to form a plurality of electronic devices shown in FIG. 15. The external leads 21b may be bent as shown in FIG. 16 for installing on a printed substrate.

We claim:

1. A method of manufacturing electronic devices, comprising the steps of :

forming an elongated metal strip having a plurality of portions each to be a metal substrate and fastening means formed by at least an indent and a fastening piece, said indent being formed at a longer side of the metal strip and said fastening piece protruding along the indent so as to form a slit with the remaining material of the metal strip;

forming a lead frame having a plurality of units of leads and at least a tab, said lead units corresponding to said metal substrates, respectively, and said tab being bent at a predetermined angle against the major plane of the lead frame and formed so as to be registered with said slit of the metal strip ;

disposing said lead frame over said metal strip with a predetermined distance therebetween so that said tab is inserted in said slit and said lead units face the corresponding metal substrates, respectively ;

bending the fastening piece toward the tab inserted in the slit so as to lock said lead frame with said metal strip ;

encapsulating each combination of the metal substrate and the lead unit unitarily with plastic material; and cutting the metal strip and the lead frame to form individual electronic devices each including the metal substrate and the leads.

2. The method of claim 1, wherein said fastening means includes a pair of the combinations of the indents and the fastening pieces, one combination of the indent and the fastening piece being formed at one of the longer sides of the metal strip, the other combination of the indent and the fastening piece being formed at the other of the longer sides and said lead frame has a pair of the tabs corresponding to the pair of the indent-fastening piece combinations.

3. The method of claim 2, wherein said fastening means are formed at each portion of the metal strip between said metal substrates, and said lead frame has said pair of the tabs at each portion between the lead units.

4. The method of claim 3, wherein a pair of the fastening pieces are formed along each indent so that the tips of the fastening pieces face to each other.

5. The method of claim 4, wherein each tab is constituted by a wide portion and a narrow portion, the wide portion being rooted on the major plane of the lead frame and having a width larger than that of the slit of the fastening means, the narrow portion being spaced from the major plane of the lead frame and having a width less than that of the slit, the tip of the wide portion contacting the surface of the metal strip to provide said predetermined distance between the lead frame and the metal strip while the narrow portion is inserted in the slit.

6. The method of claim 5, wherein each tab is flexed against the bent fastening pieces so as to provide an additional force to lock the lead frame with said metal strip.

7. The method of claim 6, before the step of encapsulating further comprising the steps of mounting a semiconductor chip on each metal substrate, and electrically connecting the electrode terminals on each chip with the leads of the corresponding lead unit, respectively.

* * * * *